United States Patent
Yamada

(10) Patent No.: US 7,671,472 B2
(45) Date of Patent: Mar. 2, 2010

(54) SEMICONDUCTOR DEVICE AND FABRICATION METHOD FOR THE SAME

(75) Inventor: Masaki Yamada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 11/274,477

(22) Filed: Nov. 16, 2005

(65) Prior Publication Data

US 2006/0118963 A1    Jun. 8, 2006

(30) Foreign Application Priority Data

Nov. 22, 2004  (JP) ............................. 2004-337459

(51) Int. Cl.
*H01L 29/40* (2006.01)
(52) U.S. Cl. ............... 257/752; 257/750; 257/E23.142; 257/E23.145; 257/E23.151
(58) Field of Classification Search ......... 257/750–770, 257/E23.142, E23.145, E23.151, E23.152, 257/E23.154, E23.155, E23.157–E23.161, 257/E23.163
See application file for complete search history.

(56) References Cited

U.S. PATENT DOCUMENTS 5,306,952 A * 4/1994 Matsuura et al. ............ 257/165
6,731,007 B1 * 5/2004 Saito et al. ................... 257/762
2002/0036309 A1 * 3/2002 Sekiguchi et al. ............ 257/301
2004/0183202 A1 * 9/2004 Usami ......................... 257/762

FOREIGN PATENT DOCUMENTS

JP          2003-031575 A          1/2003

* cited by examiner

*Primary Examiner*—Zandra Smith
*Assistant Examiner*—Paul E Patton
(74) *Attorney, Agent, or Firm*—Foley & Lardner LLP

(57) ABSTRACT

A semiconductor device includes a first interlayer insulating film formed on a semiconductor substrate; a second interlayer insulating film formed on the first interlayer film and including a plurality of grooves; a first barrier metal formed on inner surfaces of the grooves; a first interconnect part and a first bonding electrode part including a copper film formed on the first barrier metal; a second barrier metal formed on the first interconnect part and the first bonding electrode part; a second interconnect part including a metal film formed on the first interconnect part via the second barrier metal; a second bonding electrode part including a metal film formed on the first bonding electrode part via the second barrier metal; and a third interlayer insulating film formed on the second interlayer insulating film, the second interconnect part, and the second bonding electrode part, and including an opening that allows exposure of the surface of the second bonding electrode part.

7 Claims, 4 Drawing Sheets

SEMICONDUCTOR DEVICE AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Application P2004-337459 filed on Nov. 22, 2004; the entire contents of which are incorporated by reference herein.

BACKGROUND OF THE INVENTION

1. Field of the Invention

The present invention relates to a semiconductor device and a fabrication method for the same.

2. Description of the Related Art

In recent years, along with miniaturization of LSIs, copper wires having low resistance (specific resistance is approximately 35% that of aluminum) and high electromigration tolerance are used as interconnect material for semiconductor devices since the sub-quarter micron age. Particularly, use of copper wires for the top layer interconnects required to carry a large current are very effective and are used for all multi-layered interconnects. However, copper is easily oxidized, and oxidation occurs not only in a hot atmosphere without a controlled oxygen concentration but also in atmospheric air. Once copper begins to oxidize, the oxidation continues deep into the copper without stopping at the surface, thereby corroding the entire copper interconnect. Therefore, in the case of bonding electrodes formed of copper wires, not only do the electrode surfaces become oxidized and lose adhesiveness with bonding wires, but corrosion of the oxidized electrodes due to interior oxidation progresses, and corrosion due to oxidation extends to the overall bonding wires and the copper wires.

As a result, when using copper as the interconnect material, technology for forming bonding electrodes using a material, instead of copper, that is resistant to oxidation is generally employed. FIG. 7 shows a conventional semiconductor device having bonding electrodes on top of copper wires. The bonding electrodes are made of a material resistant to oxidation (see Japanese Patent Application Laid-open No. 2003-31575 (p. 7, FIG. 7B), for example). The semiconductor device of FIG. 7 is formed through the processes described below. First, an interconnect pattern groove is formed in an insulating film 31 such as a silicon oxide film formed on a semiconductor substrate, a barrier metal 32 and a copper film 33 are deposited in the groove, and are then planarized using chemical mechanical polishing (CMP) so that only the copper film 33 remains in the groove. A diffusion preventive film 34 and an insulating film 35 such as a silicon oxide film are then deposited on the planarized area, forming an intermediate insulating film. An opening is formed in the diffusion preventive film 34 and the insulating film 35 or the intermediate insulating film so as to expose a part of the copper film 33.

Next, a barrier metal 36, which prevents a reaction from occurring between copper and aluminum, an aluminum film 37, and a barrier metal 38, which reduces reflectivity of the aluminum film 37 surface and allows lithography of an interconnect pattern, are successively deposited on the exposed part of the copper film and then removed through etching, except for a region in which a bonding electrode is supposed to be formed. Last, an insulating film 39 is deposited across the entirety and the insulating film 39 and the barrier metal 38 are selectively etched so as to expose the aluminum film 37, thereby forming a bonding opening 40 on top of the aluminum film 37. This completes the bonding electrode.

However, with the above invention, when the aluminum film is formed in the groove formed by etching the intermediate insulating film, there is a problem of poor coverage may occur ability since the groove is concave.

In order to improve this process, a semiconductor device has been manufactured in which a bonding electrode is formed by embedding a copper film in a groove formed in the intermediate insulating film layer to form a via, planarizing the top of the intermediate insulating film, depositing an aluminum film, and then etching.

However, with the two above-given processes of forming an aluminum film or a bonding electrode on such copper wires, cost has increased due to the fact that after the copper wires are formed, several additional processes such as forming an insulating film, a lithography process, and an etching process are necessary. Thus, the number of processes, until the bonding electrode is completed is increased.

SUMMARY OF THE INVENTION

An aspect of the present invention inheres in a semiconductor device which includes a first interlayer insulating film formed on a semiconductor substrate; a second interlayer insulating film formed on the first interlayer film and including a plurality of grooves; a first barrier metal formed on inner surfaces of the grooves; a first interconnect part and a first bonding electrode part including a copper film formed on the first barrier metal; a second barrier metal formed on the first interconnect part and the first bonding electrode part; a second interconnect part including a metal film formed on the first interconnect part via the second barrier metal; a second bonding electrode part including a metal film formed on the first bonding electrode part via the second barrier metal; and a third interlayer insulating film formed on the second interlayer insulating film, the second interconnect part, and the second bonding electrode part, and including an opening that exposes of the surface of the second bonding electrode part.

Another aspect of the present invention inheres in a semiconductor device which includes a first interlayer insulating film formed on a semiconductor substrate; a second interlayer insulating film formed on the first interlayer film and including a plurality of grooves; a first barrier metal formed on inner surfaces of the grooves; a first interconnect part including a copper film formed on the first barrier metal; a first bonding electrode part formed in the second interlayer insulating film; a second barrier metal formed on the first interconnect part and the first bonding electrode part; a second interconnect part including a metal film formed on the first interconnect part via the second barrier metal; a second bonding electrode part including a metal film formed on the first bonding electrode part via the second barrier metal; and a third interlayer insulating film formed on the second interlayer insulating film, the second interconnect part, and the second bonding electrode part, and including an opening that exposes the surface of the second bonding electrode part.

Another aspect of the present invention inheres in a semiconductor device which includes a first interlayer insulating film formed on a semiconductor substrate; a second interlayer insulating film formed on the first interlayer film including a plurality of grooves; a first barrier metal formed on inner surfaces of the grooves; an interconnect part and a first bonding electrode part including a copper film formed on the first barrier metal; a second barrier metal formed on the first interconnect part and the first bonding electrode part; a fuse interconnect part including a metal film formed on the interconnect part via the second barrier metal; a second bonding electrode part including a metal film formed on the first bonding electrode part via the second barrier metal; and a third interlayer insulating film formed on the second interlayer insulating film, the fuse interconnect, and the second bonding electrode part. The third interlayer insulating film includes a concave part on the fuse interconnect part and an opening which exposes the surface of the second bonding electrode part, on the second bonding electrode part.

Another aspect of the present invention inheres in a semiconductor device fabrication method which includes forming a first interlayer insulating film on a semiconductor substrate; forming on the first interlayer film a second interlayer insulating film including a plurality of grooves; forming a first barrier metal on inner surfaces of the grooves; forming on the first barrier metal a first interconnect part and a first bonding electrode part including a copper film; forming a metal film on the first interconnect part via the second barrier metal, and patterning the metal film and forming a second interconnect part on the first interconnect part via the second barrier metal; depositing a metal film on the first bonding electrode part via the second barrier metal, and patterning the metal film and forming a second bonding electrode part on the first bonding electrode part via the second barrier metal; and depositing a third interlayer insulating film on the entirety of the semiconductor substrate, and forming an opening on the third interlayer insulating film that exposes the surface of the second bonding electrode part.

Another aspect of the present invention inheres in a semiconductor device fabrication method which includes forming a first interlayer insulating film on a semiconductor substrate; forming on the first interlayer film a second interlayer insulating film including a plurality of grooves; forming a first barrier metal on inner surfaces of the grooves; forming on the first barrier metal an interconnect part and a first bonding electrode part including a copper film; forming a second barrier metal on the interconnect part and the first bonding electrode part; depositing a metal film on the second barrier metal, and patterning the metal film and forming a fuse interconnect part on the interconnect part; depositing a metal film on the second barrier metal, and patterning the metal film and forming a second bonding electrode part on the first bonding electrode part; and depositing a third interlayer insulating film on the entirety of the semiconductor substrate, and forming a concave part on the fuse interconnect part and the second bonding electrode part.

DETAILED DESCRIPTION OF THE INVENTION

Figure 1:
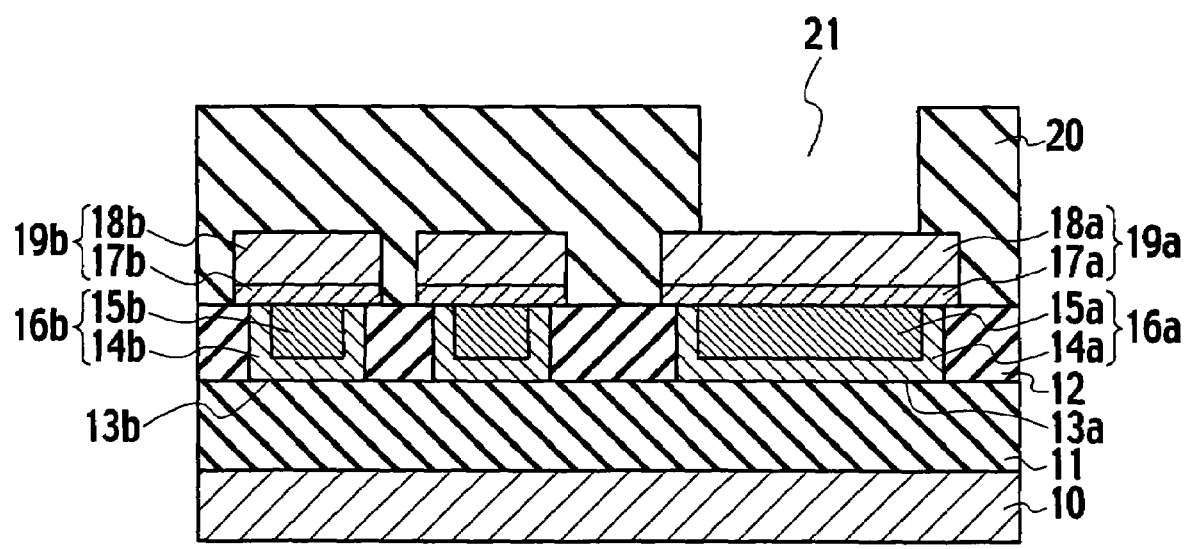
FIG. 1 is a cross-section showing a structure of the top interconnect layer of a semiconductor device, according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify a semiconductor device and a fabrication method for the semiconductor device that are used to implement the technical ideas according to the present invention, and do not limit the technical ideas according to the present invention to those that appear below. These technical ideas, according to the present invention, may receive a variety of modifications that fall within the claims.

According to the present invention, simplifying the bonding electrode formation process reduces fabrication cost and provides a lower resistance top layer interconnects.

First Embodiment

Embodiments of the present invention are described forthwith while referencing the drawings.

FIG. 1 is a cross-section showing a structure of the top interconnect layer of a semiconductor device, according to the first embodiment of the present invention. An interlayer insulating film 11 and an interlayer insulating film 12 for providing insulation between layers are successively formed on an interconnect underlayer 10. The underlayer 10 has multiple layers of semiconductor elements and interconnects on a semiconductor substrate. Grooves 13a and 13b are formed in the interlayer insulating film 12 according to an interconnect pattern of the top interconnect layer. Tantalum films 14a and 14b as barrier metals will serve as a diffusion preventive film and an oxidation preventive film for copper films 15a and 15b, and the copper films 15a and 15b are embedded in grooves, to form a bonding electrode part 16a and an interconnect part 16b. In addition, a bonding electrode part 19a and an interconnect part 19b, which are made up of stacked tantalic nitride films 17a and 17b as barrier metals and aluminum films as metal films 18a and 18b, respectively, are formed wider than the bonding electrode part 16a and the interconnect part 16b thereupon. The bonding electrode parts 16a and 19a and the interconnect parts 16b and 19b then become integral, respectively, as a single bonding electrode and a single interconnect part. Furthermore, an opening 21 is formed in the interlayer insulating film 20 so as to expose the surface of the bonding electrode part 19a, thereby completing the entire structure of the top interconnect layer.

Figure 2A:
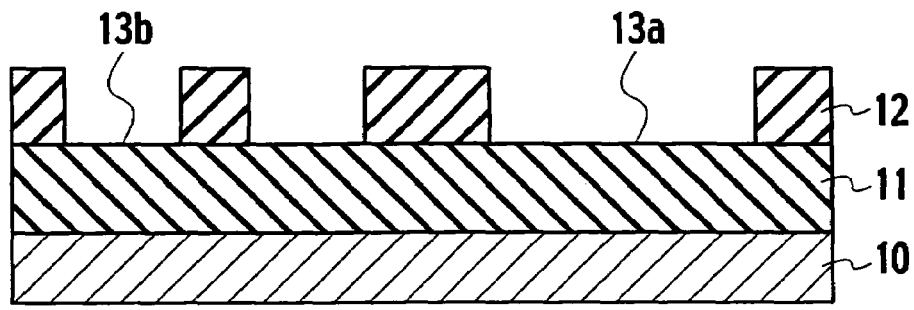
FIG. 2A is a cross-section showing a step of a fabrication process for the semiconductor device, according to the first embodiment of the present invention.

Next, a fabrication method for the semiconductor device of the embodiment is shown in the process cross-sections of FIG. 2. First, as shown in FIG. 2A, an interlayer insulating film 11 and an interlayer insulating film 12 for providing insulation between layers are successively deposited on an interconnect underlayer 10. The underlayer 10 is formed with multiple layers of semiconductor elements and interconnects on the semiconductor substrate. Grooves 13a and 13b, to be filled in with copper films, are formed in the interlayer insulating film 12 through an etching process using lithography and dry etching.

Figure 2B:
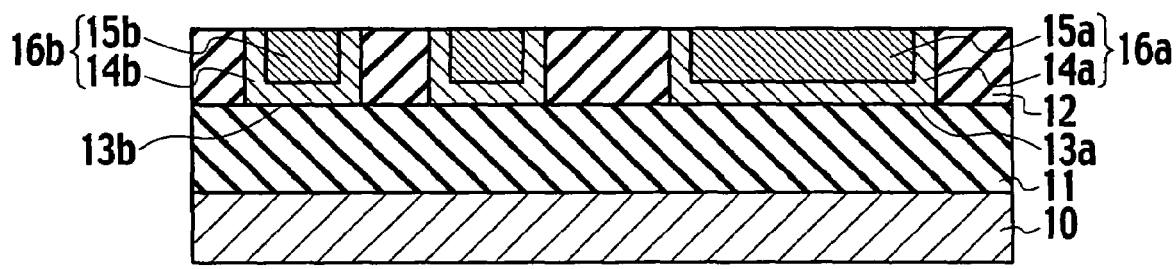
FIG. 2B is a cross-section showing a step of a fabrication process for the semiconductor device, according to the first embodiment of the present invention.

Next, as shown in FIG. 2B, barrier metals 14a and 14b, which become diffusion preventive films and oxidation preventive films for copper films, are thinly formed in the respective grooves 13a and 13b, and copper films 15a and 15b are formed thereupon to completely fill in the respective grooves 13a and 13b. Formation of copper films 15a and 15b includes forming a tantalum film as a barrier metal by sputtering, depositing a thin copper film without exposing it to the air, and then depositing a copper film by electrolytic plating. The copper film across the entirety of the surface is polished by CMP or the like, and the surface is planarized so that the copper films 15a and 15b remain in the grooves 13a and 13b, thereby forming a bonding electrode part 16a and an interconnect part 16b.

Figure 2C:
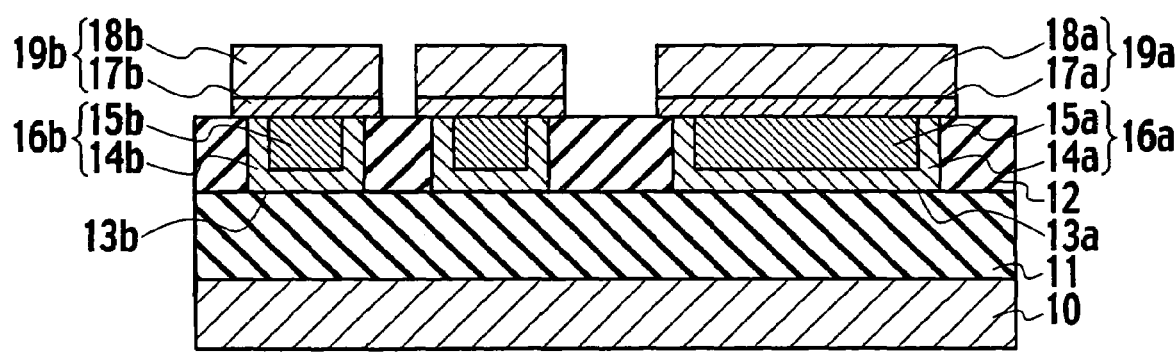
FIG. 2C is a cross-section showing a step of a fabrication process for the semiconductor device, according to the first embodiment of the present invention.

Next, as shown in FIG. 2C, barrier metals 17a and 17b, which will serve as a diffusion preventive film and an oxidation preventive film for the copper films, and metal films 18a and 18b are successively deposited on the bonding electrode part 16a and the interconnect part 16b, respectively. The metal films 18a and 18b are subjected to an etching process so as to completely cover the bonding electrode part 16a and the interconnect part 16b, thereby forming a bonding electrode part 19a and an interconnect part 19b. Formation of the metal films 18a and 18b includes depositing a tantalic nitride film, which is a barrier metal, and then depositing an aluminum film without exposing it to the air.

Afterwards, as shown in FIG. 1, an interlayer insulating film 20, which becomes a protective film, is deposited so as to cover the bonding electrode part 19a and the interconnect part 19b. Thermal treatment may be applied after this step as needed. By carrying out an etching process so as to expose the surface of the bonding electrode part 19a and form an opening 21, the semiconductor device of the embodiment is formed.

According to the above structure, forming the bonding electrode part 16a at the same time as the interconnect part in the top interconnect layer, forming the metal films 18a and 18b, which correspond to the bonding electrode part 19a, via the barrier metals 17a and 17b, and then etching the metal films 18a and 18b, which is a simpler process than the conventional process, results in completion of the bonding electrode part and reduction of fabrication cost. Instead of forming the interconnect part in the top interconnect layer by a copper film only, a metal film used for the bonding electrode is formed on the copper film so as to provide an integral layer and then etching the layer, and forming an interconnect part made of the stacked metal film and copper film, provides a lower resistance interconnect part.

Figure 3:
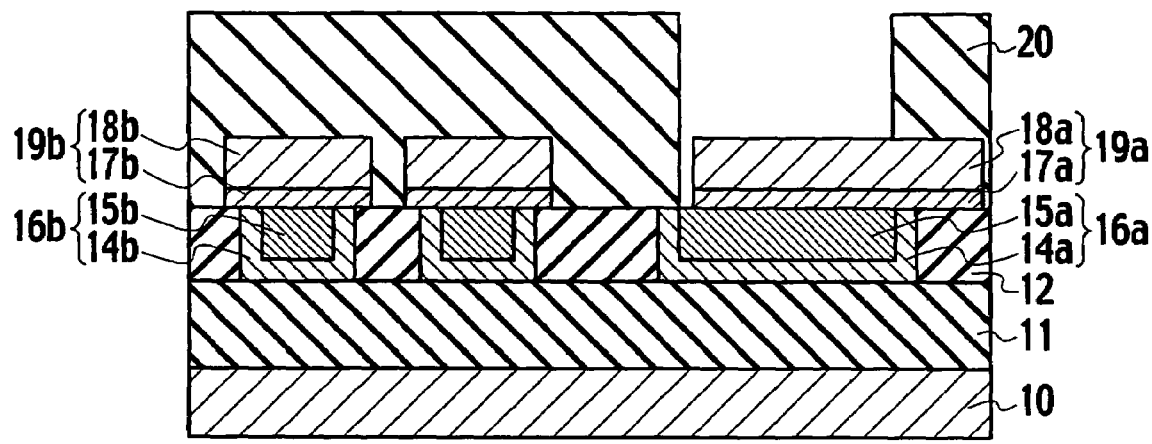
FIG. 3 is a cross-section showing a structure of the top interconnect layer resulting from misalignment in the semiconductor device, according to the first embodiment of the present invention.

Furthermore, the interconnect width of the bonding electrode part 19a and the interconnect part 19b is preferably wider than that of the bonding electrode part 16a and the interconnect part 16b, as shown in FIG. 1. An exemplary top layer interconnect structure including misalignment that has occurred when the interconnect width of the bonding electrode part 16a and that of the interconnect part 16b are the same as the bonding electrode part 19a and the interconnect part 19b, respectively is shown in FIG. 3. It can be recognized that the copper film of the bonding electrode part 16a is exposed due to the misalignment. Since this exposure of the copper film may cause oxidation and corrosion thereof, an increase in the interconnect width prevents exposure of the copper film that occurs due to the misalignment as well as accompanying oxidation and corrosion thereof.

Furthermore, a difference in the level between a first bonding electrode part 16a and a first interconnect part 16b occurs when selectively and somewhat excessively polishing only copper film portions of the first bonding electrode part 16a and the first interconnect part 16b. A difference in the level between the interlayer insulating film 12 and the copper films 15a and 15b and the deposited barrier metals 17a and 17b and the metal films 18a and 18b can be used as a marker for mask formation necessary in forming a second bonding electrode part 19a and a second interconnect part 19b. Thus, formation of a marker may be omitted.

Second Embodiment

Figure 4:
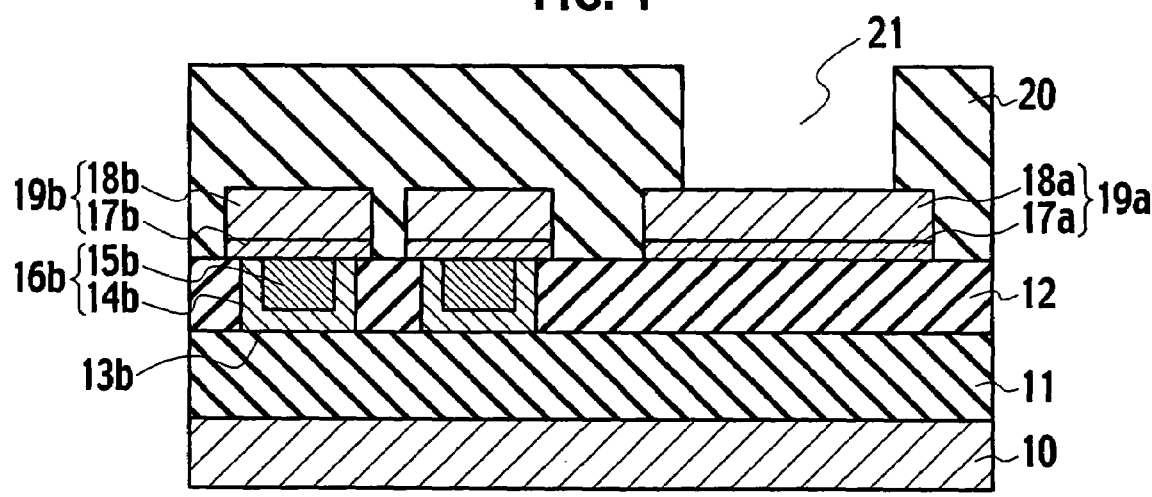
FIG. 4 is a cross-section showing a structure of the top interconnect layer of a semiconductor device, according to a second embodiment of the present invention.

FIG. 4 is a cross-section showing a structure of the top interconnect layer of a semiconductor device, according to the second embodiment of the present invention. The difference of the second embodiment from the first embodiment is that the bonding electrode part 16a of the top interconnect layer is not formed and the copper film 15a is not embedded.

First, the process for forming the structure shown in FIG. 4 includes successively depositing an interlayer insulating film 11 and an interlayer insulating film 12 for providing insulation between layers on an interconnect underlayer 10. The underlayer 10 has multiple layers of semiconductor elements and interconnects on the semiconductor substrate. A groove 13b is then formed to be filled with a copper film in the interlayer insulating film 12 through an etching process using lithography and dry etching. The groove 13a used for the bonding electrode part 16a is not formed here.

Next, a barrier metal 14b, which will serve as a diffusion preventive film and an oxidation preventive film for a copper film 15b, is thinly formed in the groove 13b, and the copper film 15b is formed thereupon to completely fill the groove 13b. Formation of the copper film includes forming a tantalum film as a barrier metal by sputtering, and depositing a thin copper film without exposing it to the air, and then depositing a copper film through electrolytic plating. The copper film across the entirety of the surface is polished by CMP or the like, and the surface is then planarized so that the copper film 15b remains in the groove 13b, thereby forming only an interconnect part 16b.

Next, barrier metals 17a and 17b, which will serve as a diffusion preventive film and an oxidation preventive film for copper films, and metal films 18a and 18b, are successively deposited in regions where the interconnect part 16b and a bonding electrode part are supposed to be formed, respectively. The metal films 18a and 18b are then subjected to an etching process using a photoresist as a mask so that the interconnect part 16b is completely covered, thereby forming a bonding electrode part 19a and an interconnect part 19b. Formation of the metal films 18a and 18b includes depositing a tantalic nitride film, which is a barrier metal, and then depositing an aluminum film without exposing it to the air.

Afterwards, as shown in FIG. 4, an interlayer insulating film 20 is deposited so as to cover the bonding electrode part 19a and the interconnect part 19b. Thermal treatment may be applied after this step as needed. By carrying out an etching process so as to expose the surface of the bonding electrode part 19a, thereby forming an opening 21, the semiconductor device of the second embodiment is formed.

Figure 5:
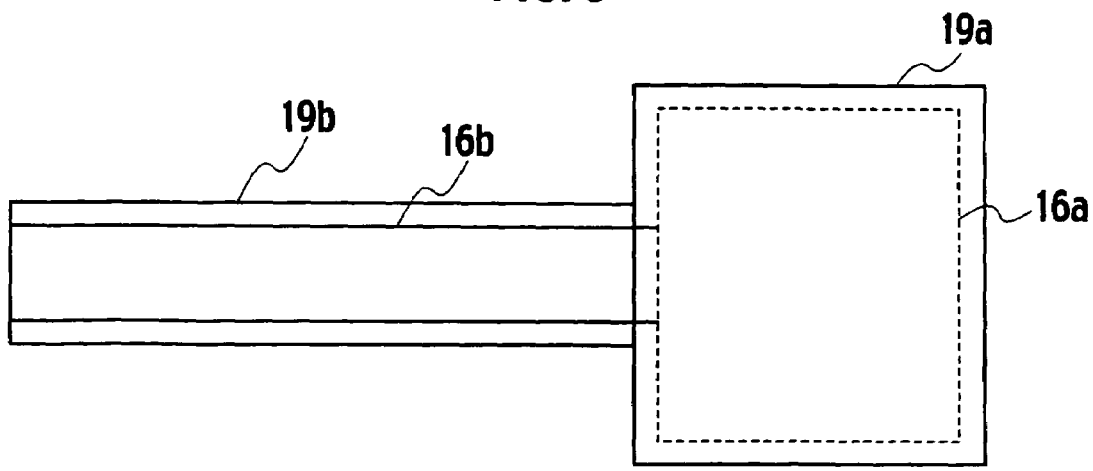
FIG. 5 is a cross-section showing a structure of the vicinity of a bonding electrode of the semiconductor device, according to the second embodiment of the present invention.

FIG. 5 is a cross-section of a structure of the semiconductor device, according to the second embodiment of the present invention, from a bonding electrode part to an interconnect part. The interconnect part is constituted by the integral interconnect part 16b and the interconnect part 19b extending to the bonding electrode part, and the bonding electrode part is formed of only the bonding electrode part 19a. A dotted line within the bonding electrode part 19a indicates the bonding electrode part 16a of the first embodiment. The bonding electrode part 19a is electrically connected to the interconnect part since the metal film and the copper film are integrated in the interconnect part.

According to the second embodiment of the present invention, not only can the same effects as described with the first embodiment be achieved, formation of the bonding electrode with just the bonding electrode part 19a prevents oxidation and corrosion of the copper film that occurs due to exposure of the copper film when a break or a crack forms in the bonding electrode part 19a. Such break or crack may occur from wire bonding and extends to the copper film of the bonding electrode part 16a in the underlayer of the first embodiment. The break or crack may also occur due to a break of the bonding electrode part, made of the copper wire, due to pressure applied during wire bonding.

Third Embodiment

Figure 6:
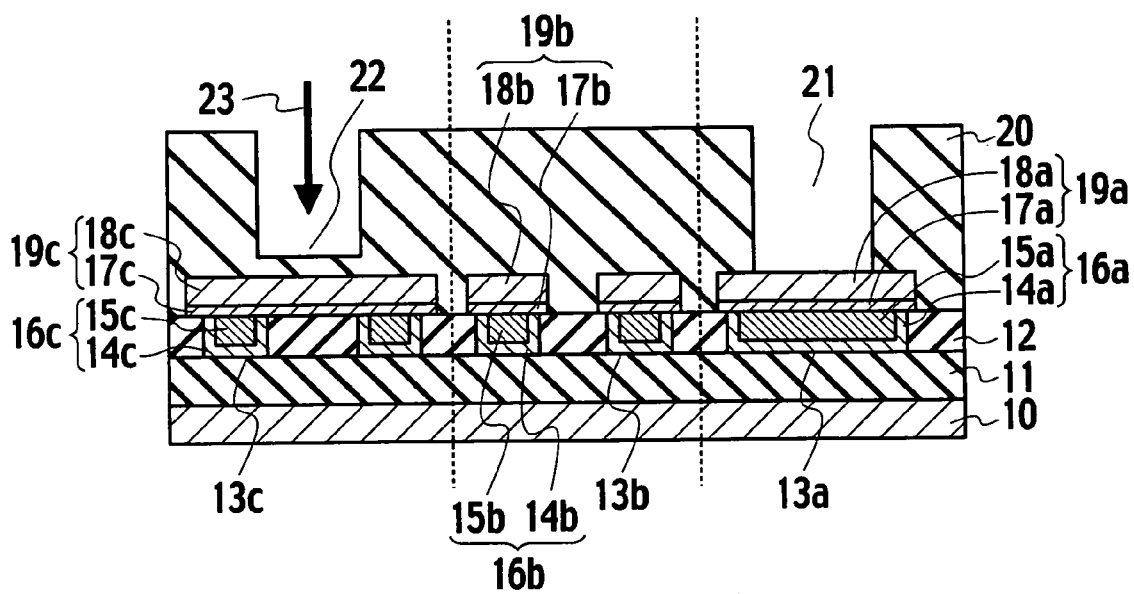
FIG. 6 is a cross-section showing a structure of the top interconnect layer of a semiconductor device, according to a third embodiment of the present invention.
Figure 7:
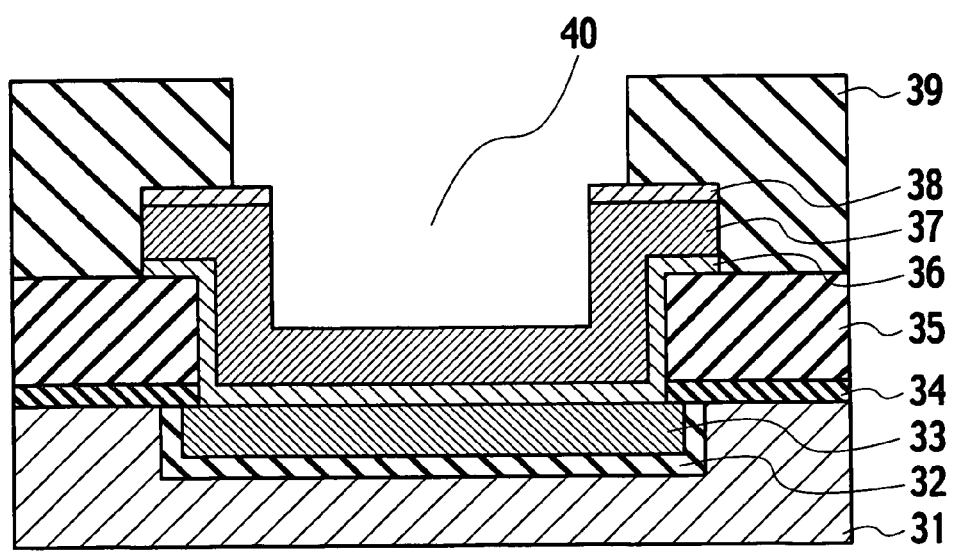
FIG. 7 is a cross-section showing a structure of the top interconnect layer of a conventional semiconductor device.

FIG. 6 is a cross-section of a structure of the top interconnect layer of a semiconductor device, according to the third embodiment of the present invention.

The difference between the third embodiment and the aforementioned embodiments is that a fuse interconnect part is formed in addition to the bonding electrode part of the top interconnect layer and the interconnect part.

A process according to the third embodiment for simultaneously forming the bonding electrode part, the interconnect part, and the fuse interconnect part is described forthwith. First, an interlayer insulating film 11 and an interlayer insulating film 12 for providing insulation between layers are successively deposited on an interconnect underlayer 10. The underlayer 10 has multiple layers of semiconductor elements and interconnects on the semiconductor substrate. Grooves 13a, 13b, and 13c to be filled with copper films are then formed in the interlayer insulating film 12 by an etching process using lithography and dry etching.

Next, barrier metals 14a, 14b, and 14c, which will serve as a diffusion preventive films and an oxidation preventive film for copper films, are thinly formed in the respective grooves 13a, 13b, and 13c. Copper films 15a, 15b, and 15c are then formed thereupon to completely fill in the respective grooves 13a, 13b and 13c. Formation of the copper films 15a, 15b, and 15c includes forming a tantalum film as a barrier metal by sputtering, depositing a thin copper film without exposing it to the air, and then depositing a copper film by electrolytic plating. The copper film across the entirety of the surface is polished by CMP or the like. The surface is planarized so that the copper films 15a, 15b and 15b remain in the respective grooves 13a, 13b, and 13c, thereby forming a bonding electrode part 16a and interconnect parts 16b and 16c.

Next, barrier metals 17a, 17b, and 17c, which will serve as a diffusion preventive film and an oxidation preventive film for copper films, and metal films 18a, 18b, and 18c are successively deposited on the bonding electrode part 16a and the interconnect parts 16b and 16c, respectively. The metal films 18a, 18b, and 18c are then subjected to an etching process so as to completely cover the bonding electrode part 16a and the interconnect parts 16b and 16c, thereby forming a bonding electrode part 19a, an interconnect part 19b, and a fuse interconnect part 19c. Formation of these metal films includes depositing a tantalic nitride film, which is a barrier metal, and then depositing an aluminum film without exposing it to the air.

Afterwards, as shown in FIG. 6, an interlayer insulating film 20, which will serve as a protective film, is deposited so as to cover the bonding electrode part 19a, the interconnect part 19b, and the fuse interconnect part 19c. Thermal treatment may be applied after this step as needed. By carrying out an etching process so as to expose the surface of the bonding electrode part 19a, thereby forming the opening 21, and then forming a fuse opening 22 on the fuse interconnect part 19c using the same method, the semiconductor device of the third embodiment is formed. At this time, the fuse opening 22 is subjected to an etching process so that the fuse interconnect part 19c cannot be exposed, as shown in FIG. 6. Furthermore, as shown in FIG. 6, the interconnect part 16c should not be formed under the fuse opening 22.

The fuse interconnect part 19c of the semiconductor device, formed as in FIG. 6, is used for detaching a faulty part from a circuit that normally functions as a redundancy circuit for fault tolerance. This method may cut (blown fuse) the fuse interconnect part 19a by irradiating a laser beam 23 onto the fuse interconnect part 19c, so as to detach a faulty part from a normally functioning circuit.

According to the third embodiment of the present invention, the same effects as described with the first embodiment may be achieved. Furthermore, the fuse interconnect part is often made of a copper film in the top interconnect layer. However, since cutting the fuse interconnect part 19c requires a large amount of heat, which greatly adversely influences the surrounding interconnect part, faulty parts may further develop. With the third embodiment, the fuse interconnect part 19c may easily be cut so as to detach the faulty part by providing the fuse part of the fuse interconnect part 19c as a metal film 18c such as aluminum with a low melting point.

A copper film has been used as the top interconnect layer in the embodiments. The present invention, however, is not limited to a copper film. A different easily oxidizable metal may be used instead. Furthermore, etching back may be used instead of using the aforementioned CMP as the technology for planarizing the surface of the formed copper film. Moreover, the metal film is not limited to aluminum, and a metal resistant to oxidizing, such as tungsten, may be used. While a tantalum film or a tantalum compound, such as a tantalum nitride film, has been used as the barrier metal, a titanium film or a titanium compound, such as a titanium nitride film, may be used instead. Furthermore, the interlayer insulating film is preferably a low-k film having a low dielectric constant $k<3.0$.

Note that the present invention is not in any way limited to the embodiments described above, and various modifications may be implemented without deviating from the scope of the present invention.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor device comprising:
    a first interlayer insulating film formed on a semiconductor substrate;
    a second interlayer insulating film formed on the first interlayer film and including a plurality of grooves;
    a first barrier metal formed on inner surfaces of the grooves;
    a first interconnect part and a first bonding electrode part, including a copper film, formed on the first barrier metal;
    a second barrier metal formed on the first interconnect part and the first bonding electrode part;
    a second interconnect part, including a metal film, formed on the first interconnect part via the second barrier metal;
    a second bonding electrode part, including a metal film, formed on the first bonding electrode part via the second barrier metal; and
    a third interlayer insulating film formed on the second interlayer insulating film, the second interconnect part, and the second bonding electrode part, and including an opening that exposes the surface of the second bonding electrode part,
    wherein the first interconnect part and the first bonding electrode part are completely covered by the first barrier metal and the second barrier metal, and the first interconnect part and the second interconnect part are formed as an interconnect part in a top interconnect layer.

2. The semiconductor device of claim 1, wherein the first interconnect part and the second interconnect part form a stacked structure, are electrically connected, and are integral with each other.

3. The semiconductor device of claim 1, wherein width of the second interconnect part is wider than that of the first interconnect part.

4. The semiconductor device of claim 1, wherein width of the second bonding electrode part is wider than that of the first bonding electrode part.

5. The semiconductor device of claim 1, wherein the second interconnect part and the second bonding electrode part are aluminum.

6. The semiconductor device of claim 1, wherein a material including one of titanium and tantalum is used as the first barrier metal and the second barrier metal.

7. The semiconductor device of claim 1, wherein the interconnect part in the top interconnect layer is formed by including the copper film and the metal film.

* * * * *